(12) United States Patent
Liang et al.

(10) Patent No.: US 9,589,911 B1
(45) Date of Patent: Mar. 7, 2017

(54) INTEGRATED CIRCUIT STRUCTURE WITH METAL CRACK STOP AND METHODS OF FORMING SAME

(71) Applicant: GLOBALFOUNDRIES Inc., Grand Cayman (KY)

(72) Inventors: Jim S. Liang, Poughkeepsie, NY (US); Atsushi Ogino, Fishkill, NY (US); Roger A. Quon, Rhinebeck, NY (US); Stephen E. Greco, Stamford, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/837,461

(22) Filed: Aug. 27, 2015

(51) Int. Cl.
| | | |
|---|---|---|
| *H01L 21/14* | (2006.01) | |
| *H01L 21/784* | (2006.01) | |
| *H01L 23/528* | (2006.01) | |
| *H01L 23/538* | (2006.01) | |
| *H01L 23/00* | (2006.01) | |
| *H01L 23/535* | (2006.01) | |
| *H01L 23/532* | (2006.01) | |
| *H01L 21/768* | (2006.01) | |

(52) U.S. Cl.
CPC ...... *H01L 23/562* (2013.01); *H01L 21/76805* (2013.01); *H01L 21/76843* (2013.01); *H01L 21/76844* (2013.01); *H01L 21/76865* (2013.01); *H01L 23/535* (2013.01); *H01L 23/53266* (2013.01)

(58) Field of Classification Search
CPC ........... H01L 23/5226; H01L 23/53295; H01L 23/481; H01L 2/86877; H01L 21/76877; H01L 21/76865; H01L 21/76843; H01L 21/76844; H01L 21/76805; H01L 23/53266; H01L 2924/01029; H01L 2924/0002; H01L 21/76808; H01L 23/538; H01L 21/76831
See application file for complete search history.

(56) References Cited

U.S. PATENT DOCUMENTS

| | | |
|---|---|---|
| 5,665,655 A | 9/1997 | White |
| 5,789,302 A | 8/1998 | Mitwalsky et al. |
| 5,834,829 A | 11/1998 | Dinkel et al. |
| 6,022,791 A | 2/2000 | Cook et al. |

(Continued)

FOREIGN PATENT DOCUMENTS

| | | |
|---|---|---|
| EP | 1336200 B1 | 8/2008 |
| JP | 4647061 B2 | 3/2011 |

(Continued)

*Primary Examiner* — Jasmine Clark
(74) *Attorney, Agent, or Firm* — Yuanmin Cai; Hoffman Warnick LLC

(57) ABSTRACT

Embodiments of the present disclosure provide an integrated circuit (IC) structure with a metal crack stop and methods of forming the same. An IC structure according to embodiments of the present disclosure can include an insulator positioned over a substrate; a barrier film positioned over the insulator; an interlayer dielectric positioned over the barrier film; and a metal crack stop positioned over the substrate and laterally adjacent to each of the insulator, the barrier film, and the interlayer dielectric, wherein the metal crack stop includes a sidewall having a first recess therein, and wherein a horizontal interface between the barrier film and the interlayer dielectric intersects the sidewall of the metal crack stop.

12 Claims, 7 Drawing Sheets

(56) References Cited

U.S. PATENT DOCUMENTS

| | | |
|---|---|---|
| 6,033,791 A | 3/2000 | Smith et al. |
| 6,084,287 A | 7/2000 | Mitwalsky et al. |
| 6,091,131 A | 7/2000 | Cook et al. |
| 6,271,578 B1 | 8/2001 | Mitwalsky et al. |
| 6,365,958 B1 | 4/2002 | Ibnabdeljalil et al. |
| 6,383,893 B1 | 5/2002 | Begle et al. |
| 6,492,247 B1 | 12/2002 | Guthrie et al. |
| 6,650,010 B2 | 11/2003 | Davis et al. |
| 6,815,346 B2 | 11/2004 | Davis et al. |
| 7,098,544 B2 | 8/2006 | Edelstein et al. |
| 7,098,676 B2 | 8/2006 | Landers et al. |
| 7,109,093 B2 | 9/2006 | Fitzsimmons et al. |
| 7,112,470 B2 | 9/2006 | Daubenspeck et al. |
| 7,163,883 B2 | 1/2007 | Agarwala et al. |
| 7,273,770 B2 | 9/2007 | Edelstein et al. |
| 7,456,098 B2 | 11/2008 | Hichri et al. |
| 7,544,602 B2 | 6/2009 | Clevenger et al. |
| 7,573,130 B1 | 8/2009 | Shaw et al. |
| 7,679,200 B2 | 3/2010 | Su et al. |
| 7,955,955 B2 | 6/2011 | Lane et al. |
| 8,063,469 B2 | 11/2011 | Barth et al. |
| 8,076,756 B2 | 12/2011 | Lane et al. |
| 8,188,574 B2 | 5/2012 | Angyal et al. |
| 8,237,246 B2 | 8/2012 | Angyal et al. |
| 8,309,435 B2 | 11/2012 | Kaltalioglu et al. |
| 8,592,941 B2 | 11/2013 | Gambino et al. |
| 8,604,618 B2 | 12/2013 | Cooney, III et al. |
| 8,610,238 B2 | 12/2013 | Kaltalioglu et al. |
| 8,742,594 B2 | 6/2014 | Daubenspeck et al. |
| 8,970,008 B2 | 3/2015 | Gratz et al. |
| 8,970,009 B2 | 3/2015 | Ishii |
| 2003/0160331 A1* | 8/2003 | Fujisawa ........... H01L 21/76805 257/774 |
| 2003/0234447 A1 | 12/2003 | Yunus et al. |
| 2004/0150105 A1 | 8/2004 | Yunus et al. |
| 2007/0087067 A1 | 4/2007 | Yuan et al. |
| 2010/0283128 A1 | 11/2010 | Chen |
| 2011/0074033 A1 | 3/2011 | Kaltalioglu et al. |
| 2011/0140245 A1 | 6/2011 | Lane et al. |
| 2012/0074519 A1 | 3/2012 | Yeo et al. |
| 2013/0099391 A1 | 4/2013 | Lamorey et al. |
| 2014/0339703 A1 | 11/2014 | Farooq et al. |

FOREIGN PATENT DOCUMENTS

| | | |
|---|---|---|
| JP | 4776195 B2 | 9/2011 |
| JP | 5613290 B2 | 10/2014 |
| WO | 2007047058 A2 | 4/2007 |

* cited by examiner

INTEGRATED CIRCUIT STRUCTURE WITH METAL CRACK STOP AND METHODS OF FORMING SAME

BACKGROUND

Aspects of the disclosure relate generally to structures and manufacturing processes of integrated circuits (ICs). More specifically, embodiments of the present disclosure include an IC structure with a metal crack stop therein, and process of forming the IC structure with the metal crack stop.

Each IC of a particular device can be made up of billions of interconnected devices, such as transistors, resistors, capacitors, and diodes, located on one or more chips of semiconductor substrate material. The quality and viability of a product including an IC therein can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal layer," i.e., a metal wire for connecting several semiconductor devices together. BEOL generally includes fabrication processes following the formation of the first metal layer, including the formation of all subsequent metal layers. To provide greater scaling and sophistication of the fabricated device, the number of metal layers can be varied to suit a particular application, e.g., by providing four to six metal layers, or as many as, in a further example, sixteen or more metal layers.

As the total number of devices in each IC product continues to increase, the resilience of an IC structure to side-effects of processing and/or general wear has become increasingly significant. For example, the separation of metal layers from one another (i.e., delamination) during a dicing process can become significant where cracks form at the edge of a product and propagate toward the devices included therein. Even where dummy materials (sometimes known as "crack stops") are formed near the perimeter of a manufactured device to prevent or slow the growth of a crack, a formed crack may nevertheless circumvent the crack stop in some instances.

BRIEF SUMMARY

A first aspect of the disclosure provides an integrated circuit (IC) structure including: an insulator positioned over a substrate; a barrier film positioned over the insulator; an interlayer dielectric positioned over the barrier film; and a metal crack stop positioned over the substrate and laterally adjacent to each of the insulator, the barrier film, and the interlayer dielectric, wherein the metal crack stop includes a sidewall having a first recess therein, and wherein a horizontal interface between the barrier film and the interlayer dielectric intersects the sidewall of the metal crack stop.

A second aspect of the disclosure provides a method of forming an integrated circuit (IC) structure. Methods of forming an integrated circuit structure according to embodiments of the present disclosure can include: providing a structure including: a sacrificial metal positioned over a substrate and laterally adjacent to an insulator, a first barrier film positioned over and contacting each of the sacrificial metal region and the insulator, and a first interlayer dielectric positioned over and contacting the first barrier film; forming an opening over the substrate by removing a portion of first interlayer dielectric, a portion of the first barrier film, and the sacrificial metal; and forming a first metal crack stop within the opening and over the substrate.

A third aspect of the disclosure provides a method of forming an integrated circuit (IC) structure. Methods of forming an integrated circuit structure according to embodiments of the present disclosure can include: providing a structure including: a sacrificial metal positioned over a substrate and laterally adjacent to an insulator, a first barrier film positioned over and contacting each of the sacrificial metal and the insulator, and a first interlayer dielectric positioned over and contacting the first barrier film; forming an opening over the substrate by removing a first portion of the first interlayer dielectric, a first portion of the first barrier film, and the sacrificial metal, wherein a second portion of the interlayer dielectric and a second portion of the first barrier film remain positioned over the sacrificial metal; and forming a first metal crack stop within the opening, wherein the first metal crack stop includes a first recess intersecting an interface between the first barrier film and the first interlayer dielectric.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

DETAILED DESCRIPTION

Embodiments of the present disclosure provide an integrated circuit (IC) structure with a metal crack stop, including structures for impeding or altogether preventing delamination cracks from propagating away from a perimeter of the IC to active devices therein. The present disclosure also contemplates methods for fabricating IC structures described herein. Generally, an IC structure according to the present disclosure can include an insulator positioned over a substrate, a barrier film positioned over the insulator, and an interlayer dielectric positioned over the first barrier film. The IC structure can also include a metal crack stop positioned over the substrate, e.g., over a semiconductor region of the substrate separated from other regions by shallow trench isolations (STIs). The metal crack stop can be laterally and directly adjacent to each of the insulator, the barrier film, and the insulator dielectric. Furthermore, the metal crack stop can include a sidewall with a first recess therein. The first recess can be positioned, e.g., adjacent to a horizontal interface between the first barrier film and the interlayer dielectric, and can intersect a sidewall of the metal crack stop. Among other things, recesses included in the metal crack stop can accommodate and/or trap horizontally-propagating delamination cracks therein, such that the cracks cannot continue propagating without doing so in a partially vertically and/or horizontally reverse direction to bypass the metal crack stop.

Figure 1:
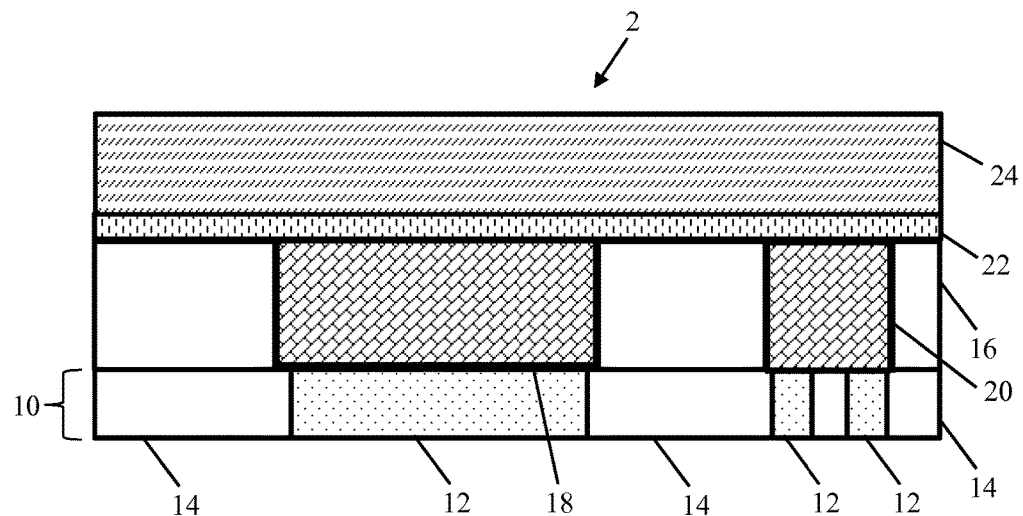
FIG. 1 shows an initial structure according to embodiments of the present disclosure.

Referring to FIG. 1, a structure 2 used for fabricating an IC according to aspects of the present disclosure is shown. Structure 2 can include a substrate 10 with semiconductor regions 12 and shallow trench isolations (STIs) 14 therein. Semiconductor regions 12 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of each semiconductor region 12 or a portion thereof may be strained. Substrate 10 can also include shallow trench isolations (STIs) 14 positioned laterally between, e.g., semiconductor regions 12. STI(s) 14 can be formed by removing portions of substrate 10 to form trenches and then filling the trenches with an electrically insulative material, e.g., one or more of the insulating materials described elsewhere herein.

An insulator 16 can be formed on and positioned above substrate 10. Insulator 16 may be composed of any insulating material such as $SiO_2$, SiN, porous $SiO_x$, and/or doped SiOx, and other currently known or later developed materials having similar properties.

A sacrificial metal 18 and a conductive region 20 can be formed on substrate 10, and within insulator 16. Sacrificial metal 18 and conductive region 20 can be composed of any currently known or later-developed conductive material, such as a metal, and in an example embodiment can be formed of the same material. Although sacrificial metal 18 and conductive region 20 are distinct structural components, sacrificial metal 18 and conductive region 20 can have the same material composition and more specifically can be yielded from the same process steps. In an example embodiment, sacrificial metal 18 and conductive region 20 can be formed by selectively removing portions of insulator 16 to form two trenches, and forming tungsten therein, e.g., by a metal deposition process. Although not shown explicitly in FIG. 1, one or more conventional liners can also be formed between insulator 16, sacrificial metal 18, and/or conductive region 20.

Structure 2 can include a barrier film 22 formed over insulator 16, sacrificial metal 18, and conductive region 20. An interlayer dielectric (ILD) 24, in turn, can be formed over barrier film 22. Barrier film 22 can be embodied as any currently known or later developed "low-k" insulating or dielectric material, such as one or more of those discussed herein with respect to insulator 16. Barrier film 22 can be adapted to insulate adjacent metal-level layers of in an integrated circuit, and can have a dielectric constant of at most approximately 3.9, e.g., the dielectric constant of silicon dioxide ($SiO2$). Where barrier film 22 includes a low-k material, the properties of barrier film 22 can reduce or prevent interlayer conductivity, i.e., "cross talk" between adjacent layers. ILD 24, also known as an "inter-metal dielectric" or "inter-level dielectric," can include any dielectric material capable of electrically separating closely spaced interconnect lines positioned in multilevel metallization regions of an IC. ILD 24 can be composed of a material with a lower dielectric constant than barrier film 22, and in an embodiment can be composed of a material having a dielectric constant between approximately 1.0 and approximately 2.0, or in any event less than approximately 3.9. As discussed elsewhere herein (e.g., relative to FIGS. 11-14), multiple barrier films 22 and ILDs 24 can be alternatingly positioned over insulator 16, sacrificial metal 18, and conductive region 20.

Figure 2:
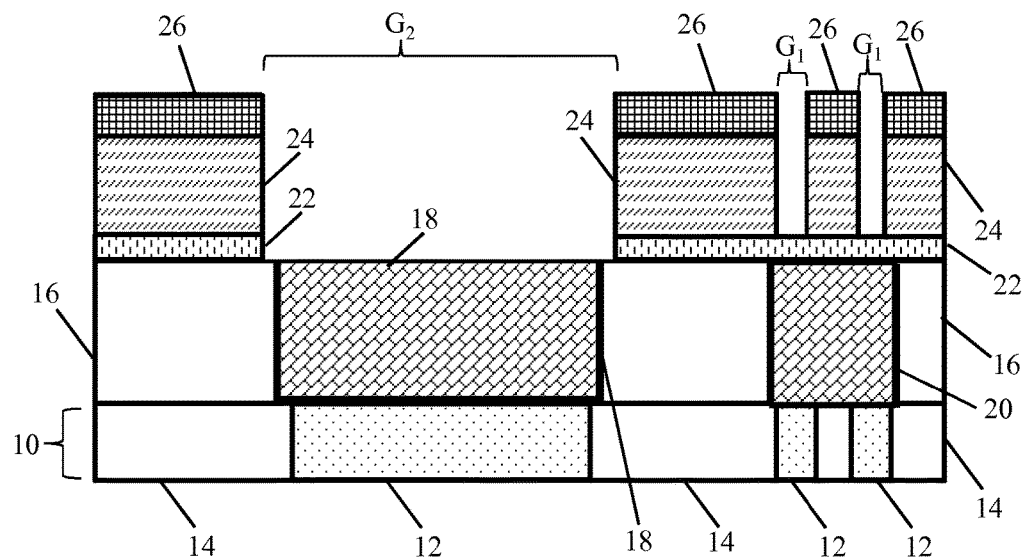
FIG. 2 shows a structure with a hard mask and partially-formed opening according to embodiments of the present disclosure.

Turning to FIG. 2, structure 2 (FIG. 1) can be processed using a masking layer as described herein. A hard mask 26 can be formed over portions of ILD 24 while leaving others exposed and subject to removal. Specifically, hard mask 26 can be patterned to allow a portion of barrier film 22 and ILD 24 positioned substantially over sacrificial metal 18 to be removed, and for portions of ILD 24 positioned over conductive region 20 to also be removed. Hard mask 26, and/or other materials described herein as being a type of "hard mask," can be composed of one or more low-temperature oxides (LToS), $SiO_x$ compounds, and/or $Si_xN_y$ compounds. Hard mask 26 can also be provided in the form of, e.g., titanium nitride, silicon nitride, and/or any other currently known or later developed materials suitable for use as a hard masking material. In an example embodiment, as shown in FIG. 2, portions of barrier film 22 and ILD 24 can be removed such that an upper surface of sacrificial metal 18 is exposed while at least a portion of barrier film 22 remains intact over conductive region 20. The term "removing" as used herein can include any one of various material removal or polishing techniques now known or later developed, including etching.

"Etching" generally refers to the removal of material from a substrate (or structures formed on the substrate), and is often performed with a mask (e.g., mask 26) in place so that material may selectively be removed from a structure, while leaving the remaining material unaffected. There are generally two categories of etching, (i) wet etch and (ii) dry etch. Wet etch is performed with a solvent (such as an acid) which may be chosen for its ability to selectively dissolve a given material (such as a metal), while leaving another material (such as insulator materials) relatively intact. The ability to selectively etch particular materials is fundamental to many semiconductor fabrication processes. A wet etch will generally etch a homogeneous material (e.g., a metal) isotropically, but a wet etch may also etch monocrystalline materials (e.g., silicon and/or insulators) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches.

In the case of RIE, a phenomenon known as "RIE lag" can permit exposure of sacrificial metal 18 while leaving a portion of barrier film 22 intact over conductive region 20. Specifically, a material subject to the same instance of RIE may be etched at different rates in different locations, particularly where a mask on the material exposes a different cross-sectional area of the material at two different locations. In general, RIE lag will cause smaller cross-sections of a material to be etched more slowly than larger cross-sections of the same material. As is shown in FIG. 2, mask 26 can include gaps $G_1$ positioned over conductive region 20 with a smaller cross section than that of a second gap $G_2$ positioned over sacrificial metal 20. During application of RIE to ILD 24 and barrier film 22, RIE lag can cause a portion of barrier film 22 to remain intact over conductive region 20 when sacrificial metal 18 becomes exposed. In an example embodiment, a cross-sectional area of gap $G_2$ can be between approximately two to three orders of magnitude (100 to 1000 times) larger than a cross-sectional area of gap $G_1$. As discussed elsewhere herein, applying RIE to remove portions of barrier film 22 and ILD 24 can allow sacrificial metal 18 to be removed while conductive region 20 is positioned beneath barrier film 22.

Figure 3:
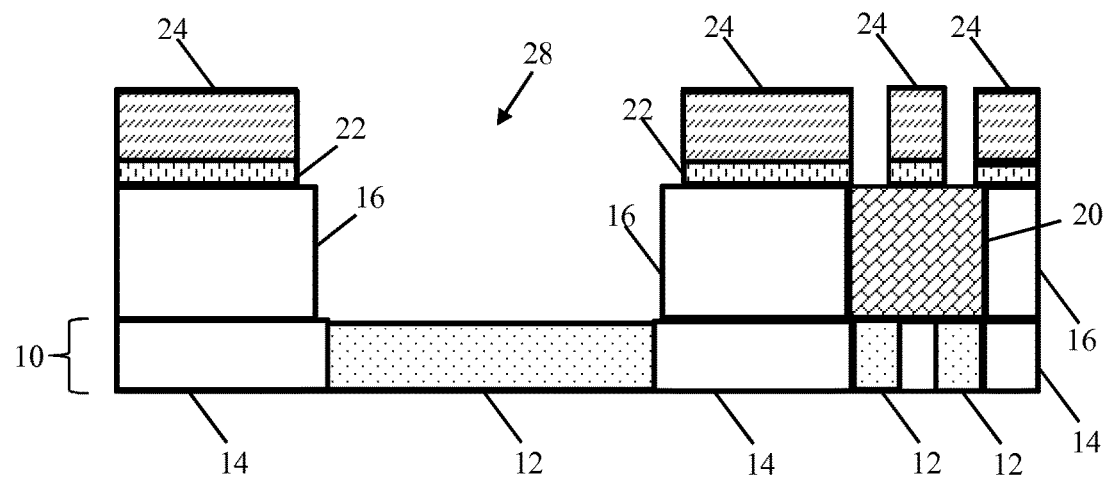
FIG. 3 shows a structure with an opening formed therein according to embodiments of the present disclosure.

Turning to FIG. 3, sacrificial metal 18 (FIGS. 1-2) can be removed to form an opening 28, and to expose an upper surface of substrate 10. Sacrificial metal 18 can be selectively removed, e.g., by application of a wet etching material selective to metals. Where sacrificial metal 18 is composed of tungsten, the process depicted in FIG. 3 can include applying a wet material which selectively etches tungsten, titanium, and/or titanium nitride (e.g., included in the composition of hard mask 26 (FIG. 2), sacrificial metal 18, and/or conductive region 20) while having a negligible effect on, e.g., insulator 16, barrier film 22, and/or ILD 24. Example wet etching solutions suitable for selectively removing sacrificial metal 18 and/or mask 26 can include, e.g., potassium ferricyanide, potassium hydroxide, potassium phosphate monobasic, ammonium fluoride, etc. It is understood that other currently known or later developed selective wet and dry etchants can be applied to remove sacrificial metal 18 and/or hard mask 26. In any event, the presence of barrier film 22 over conductive region 20 can substantially prevent conductive region 20 from being removed during the selective removing of sacrificial metal 18 and/or hard mask 26. The removing of sacrificial metal 18 can form an opening 28 positioned substantially over substrate 10. After forming opening 28, portions of barrier film 22 positioned over conductive region 20 can be removed, e.g., by further application of non-selective or dry etching processes to expose conductive region 20, allowing conductive material (e.g., in the form of vias) to be formed thereon in a subsequent process.

Figure 4:
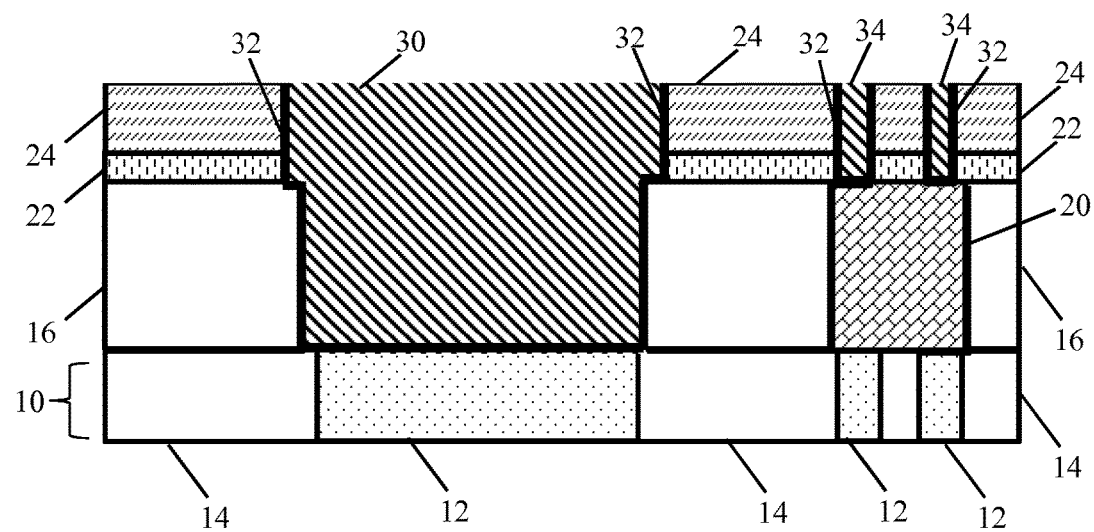
FIG. 4 shows s a structure with a metal crack stop therein according to embodiments of the present disclosure.

Referring now to FIG. 4, a first metal crack stop 30 can be formed within opening 28 (FIG. 3) by any currently known or later developed process of forming a substantially planarized metal on an IC structure, such as successive deposition and polishing. As discussed in further detail elsewhere herein, it is also understood that a liner 32, including refractory metal compounds such as a tantalum Nitride (TaN) and/or tantalum (Ta), can be formed conformally upon substrate 10, insulator 16, barrier film 22 and/or ILD 24 before first metal crack stop 30 is deposited thereon. Other refractory metals such as titanium (Ti), tungsten (W), iridium (Ir), rhodium (Rh) and platinum (Pt), etc., or mixtures of thereof, may also be included in liner 32. In any event, liners 32 can be formed within, e.g., opening 28 and over ILD 24 before first metal crack stop 30 is formed therein, to provide electrical insulation and/or structural protection between first metal crack stop 30 and adjacent materials. The term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Following deposition, some of the deposited metal may be positioned on and in contact with ILD 24 and/or other structures positioned thereon. To form first metal crack stop 30 with a desired shape and volume, the deposited metal can be polished to produce a planarized upper surface. For example, first metal crack stop 30 can be planarized by application of chemical-mechanical polishing (CMP), also known as chemical-mechanical planarization. CMP is a process, using both chemicals and abrasives, comparable to lapping (analogous to sanding), for removing material from a built up structure. For example, after depositing and etching a number of elements, the top surface of the resulting structure may be uneven and in need of smoothing (or leveling) out, prior to performing a subsequent process step. Generally, CMP will level out the high spots of a structure, leaving a relatively smooth planar surface.

The forming of first metal crack stop 30 can also include forming liner 32 over the exposed portion of conductive region 20, and forming vias 34 over liner 32 and conductive region 20. Vias 34 can be composed of any currently known or later developed conductive material, and more specifically can be composed of the same materials used to form first metal crack stop 30. Each via 34 can also include multiple sub-sections therein. For example, a portion of via 34 positioned proximal to conductive region 20 can be known as a "trench via," while other portions of via 34 can be known simply as a "via." Vias 34 can be formed, e.g., simultaneously with first metal crack stop 30 using a shared deposition and polishing process. Although first metal crack stop 30 and vias 34 can be formed with the same process step, first metal crack stop 30 can reduce the propagation of delamination cracks as discussed herein, while vias 34 can transmit electric current between layers of an IC structure as is also discussed herein.

Figure 5:
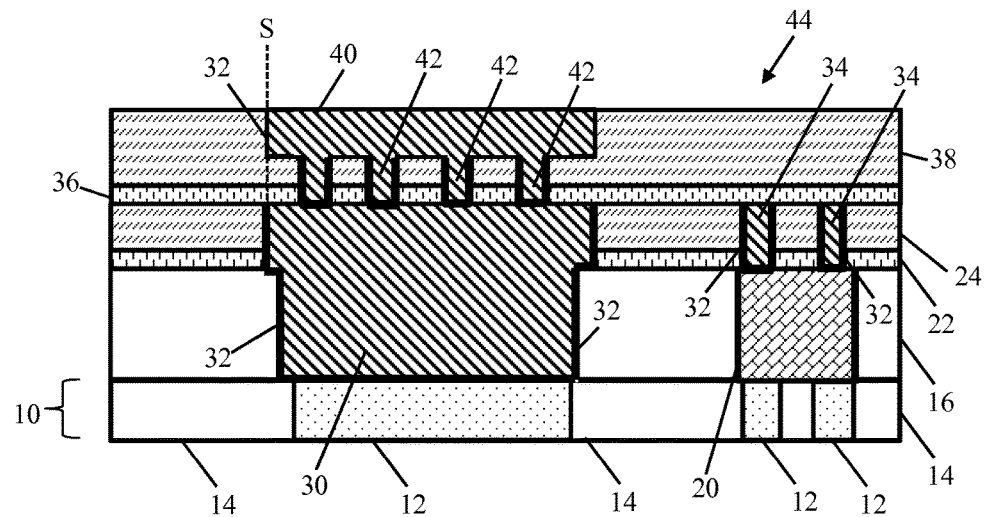
FIG. 5 shows a first illustrative IC structure according to embodiments of the present disclosure.

Turning to FIG. 5, other crack stop materials can be formed on first metal crack stop 30 during BEOL metal level formation. For example, a second barrier film 36 can be formed over ILD 24, with a second ILD 38 being formed over the second barrier film 36, such that an alternating stack of barrier films 22, 36 and ILDs 24, 38 is formed. A portion of the second barrier film 36 and second ILD 38 can then be etched away, e.g., by selective or non-selective etching, to form a via opening (identified in some cases as a trench) and expose an upper surface of first metal crack stop 30. Liner 32 can then be formed over first metal crack stop 30, second barrier film 36, and/or second ILD 38 followed by forming (e.g., by deposition) a second metal crack stop 40 over first metal crack stop 30, liner 32, second barrier film 36, and/or second ILD 38. As is shown by example in FIG. 5, second metal crack stop 40 can include a plurality of teeth 42 extending through the horizontal interface between second barrier film 36 and second ILD 38. Teeth 42 can be formed, e.g., by selectively etching portions of second ILD 38 and second barrier film 36 to expose first metal crack stop 30, while only partially etching other portions of second ILD 38 and terminating the etch before removing second barrier film 36. The different amounts of etching can be controlled, e.g., by the successive deposition of additional masks (not shown) and removal thereof from second ILD 38. The various components shown in FIG. 5 can, together, make up an IC structure 44 including first metal crack stop 30 therein.

During stress events such as the dicing of chips from a larger structure, delamination cracks traveling horizontally along an interface between barrier film 22 and ILD 24, or between barrier film 22 and insulator film 16, will be stopped at an interface with a single, one-piece a vertical sidewall S of first metal crack stop 30. That is, delamination cracks propagating along these interfaces would hit a metal wall and will meet no horizontal interface through which the crack can propagate to the other side of first metal crack stop 30. Cracks would therefore need to move vertically upwards or downwards along sidewall S of first metal crack stop 30 in order to reach another horizontal interface for further propagation. As discussed elsewhere herein, sidewall S of metal crack stop 30 can also include recesses therein for trapping and/or further impeding horizontally propagated delamination cracks.

Figure 6:
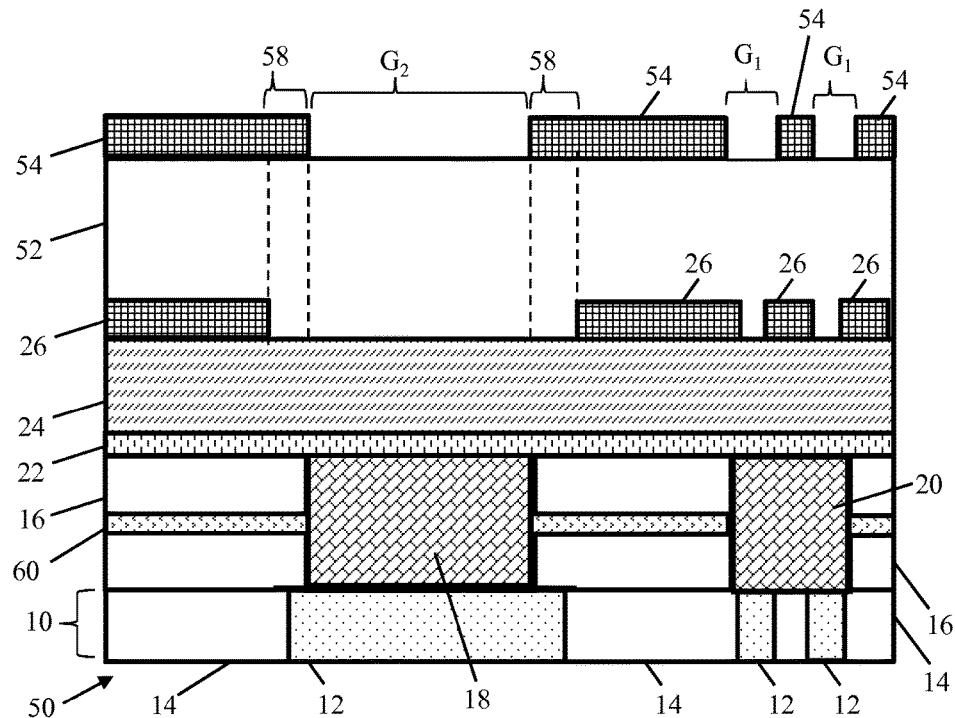
FIG. 6 shows an initial structure with two masking layers thereon according to embodiments of the present disclosure.

Turning to FIG. 6, another alternative process of forming an IC structure according to embodiments of the present disclosure is shown. A structure 50 can include, e.g., each of the structures described elsewhere herein with respect to structure 2 (FIG. 1) with additional components as discussed herein. Specifically, structure 50 can include a planarizing layer 52 over ILD 24 and hard mask(s) 26. A "planarizing layer" generally refers to any material applied to smoothen the upper surface of a structure, and can be formed by, e.g., the deposition of material followed by polishing, deposition followed by the forming of a flowable oxide material thereon, deposition alone, and/or any other currently known or later developed process or combination of processes. Planarizing layer 52 can be in the form of an organic planarizing layer (OPL) which includes one or more carbon films removable by wet and/or dry etching processes. One or more second hard masks 54 can be positioned over planarizing layer 52, and can be composed of a material with a greater resistance to etching than planarizing layer 52. For example, second hard mask(s) 54 can be composed of one or more low-temperature oxide materials. Second hard mask(s) 54 can include a gap $G_2$ therein, larger than other gaps $G_1$ positioned over conductive layer 20. Gap $G_2$ can be positioned substantially over a portion of substrate 10 beneath barrier film 22, ILD 24, and planarizing layer 52. Gap $G_2$ can be sized to provide a lateral differential 58 between the size of gap $G_2$ and a corresponding spacing between hard masks 26 positioned below second hard mask(s) 54.

Figure 7:
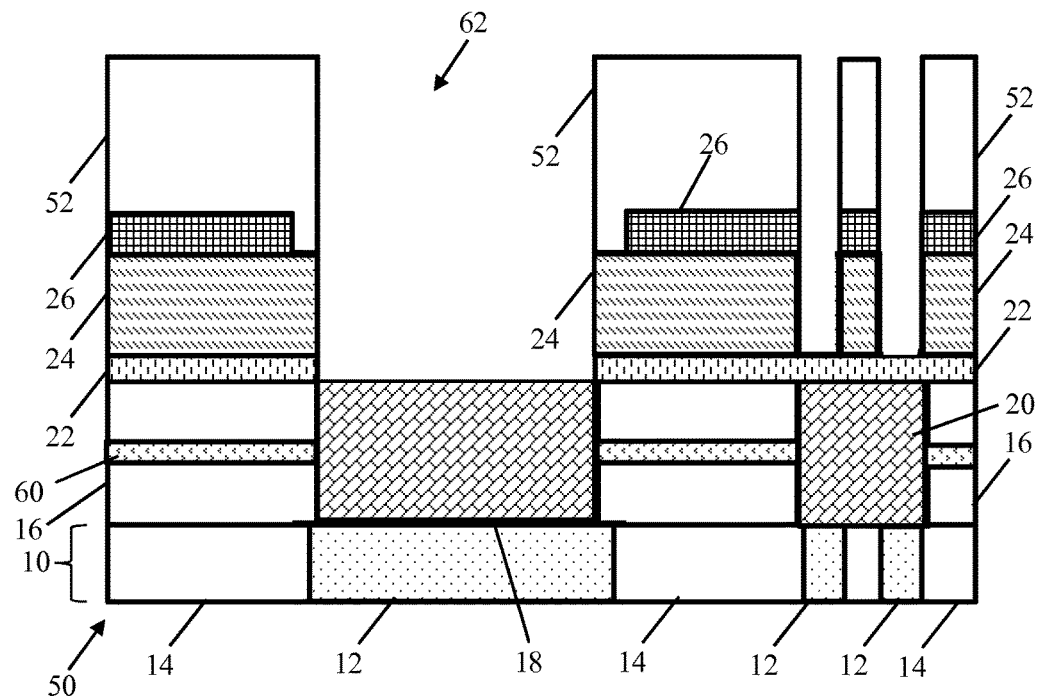
FIG. 7 shows a structure with a partially formed opening and one masking layer thereon according to embodiments of the present disclosure.

Turning to FIG. 7, portions of planarizing layer 52, ILD 24, and barrier film 22 positioned between second hard mask(s) 54 can be removed, e.g., by RIE, to form an opening 62 which exposes sacrificial metal 18. The same etching process can also remove portions of planarizing layer 52 and ILD 24 positioned over conductive region 20 while leaving barrier film 22 at least partially intact. Barrier film 22 positioned over conductive region 20 can remain present as a result of RIE lag, as discussed elsewhere herein, due to an area of the removed lateral portions being less than the area removed over sacrificial metal 18. As is shown in FIG. 7, a portion of planarizing layer 52 can remain in contact with ILD 24 without being separated therefrom by hard mask(s) 26 buried within planarizing layer 52. The portion of planarizing layer 52 positioned directly over ILD 24 can be a result of, e.g., lateral differential 58 (FIG. 6) discussed herein based on the size of gap $G_2$ (FIG. 6).

Structure 50 can, optionally, include at least one nitride region 60 (e.g., a middle of line (MOL) nitride) extending laterally through insulator 16. Nitride region 60 can have electrically insulating properties, similar to a remainder of insulator 16, yet can include a different chemical composition. More specifically, nitride region 60 can be composed of a material with a greater resistance to wet etching than a remainder of insulator 16, as discussed elsewhere herein. Where insulator 16 includes a nitride material, nitride region 60 can be composed of a different nitride material with a greater ability to resist wet etching than a remainder of insulator 16.

Figure 8:
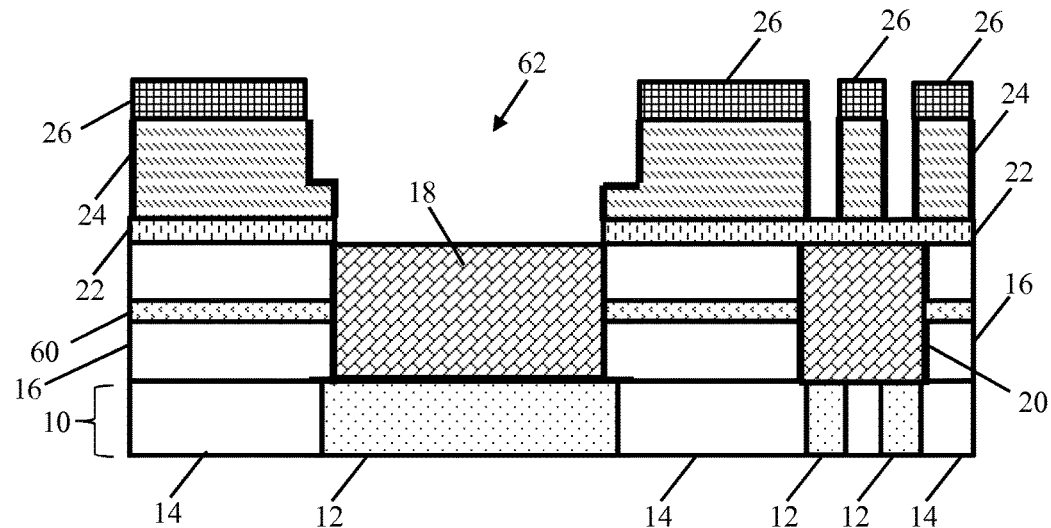
FIG. 8 shows a structure with an opening formed therein according to embodiments of the present disclosure.

Referring now to FIG. 8, further processing steps according to the present disclosure are shown. Before the removing of sacrificial metal 18, e.g., by a selective wet etching process as discussed elsewhere herein relative to FIG. 3, planarizing layer 52 and portions of ILD 24 not covered by hard mask(s) 26 can be removed through application of a selective or non-selective etching process. It is understood that the same etching process can also remove, e.g., portions of insulator 24, sacrificial metal 18 and barrier film 22. However, to protect conductive region 20 during the selective removal of sacrificial metal 18, at least a portion of barrier film 22 can remain intact over conductive region 20 before the selective removing of sacrificial metal 18. The partial removing of ILD 24 can cause portions of barrier film 22 and ILD 24 located proximal to an interface between these structures to partially extend laterally into opening 62, creating opposing steps within ILD 24 as is shown in FIG. 8.

Figure 9:
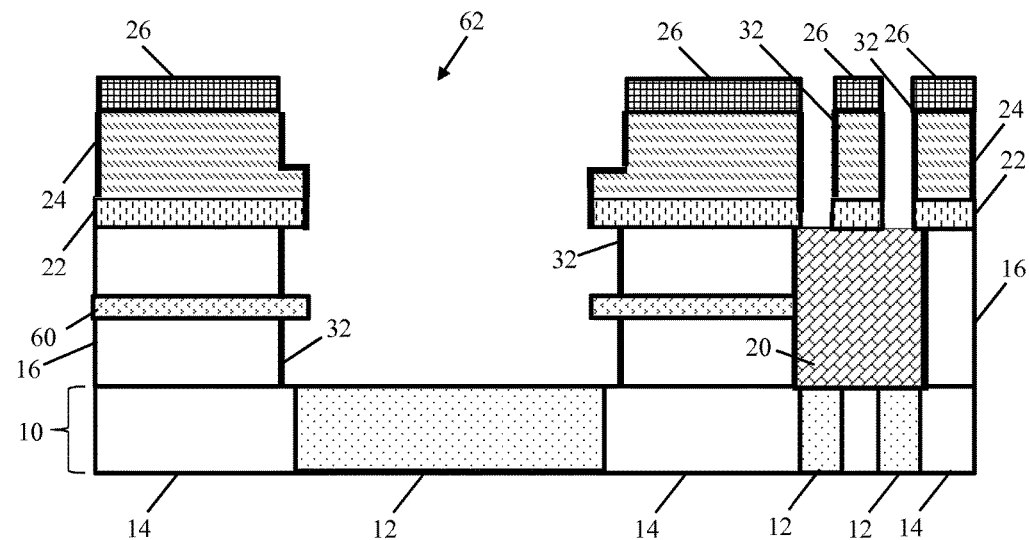
FIG. 9 shows a structure with an opening, exposed substrate, and exposed conductive region according to embodiments of the present disclosure.

As shown in FIG. 9, sacrificial metal 18 can be removed, e.g., using one or more of the selective etching processes discussed elsewhere herein, to expose substrate 10, such that a portion of barrier film 22 and ILD 24 extends horizontally into a cross-section of opening 62. After selectively removing sacrificial metal 18, a portion of barrier film 22 can then be removed to expose conductive region 20. Liner 32 can also be formed conformally over substrate 10, insulator 16, barrier film 22, and ILD 24 within opening 62 using CVD, ALD, and/or plating to form metal portions of liner 32. Where nitride region 60 is present, the removing of sacrificial metal 18 can also include removing a portion of insulator 16 such that nitride region 60 extends horizontally into opening 62. For example, where sacrificial metal 18 is removed by way of a wet etching process, the same etchant solution can selectively remove portions of insulator 16 while removing portions of nitride region 60 at a slower rate, or without affecting nitride region 60.

Figure 10:
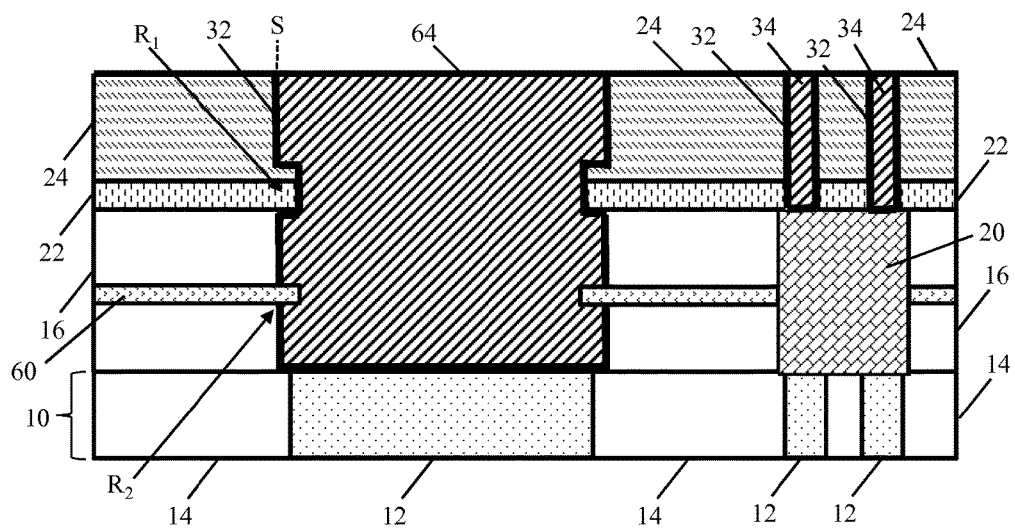
FIG. 10 shows a structure with a first metal crack stop and set of vias formed in a single metallization according to embodiments of the present disclosure.

Referring to FIG. 10, embodiments of the present disclosure can include forming a first metal crack stop 64 within opening 62 (FIGS. 7-9), optionally with vias 34 over conductive region 20. As discussed elsewhere herein, e.g., relative to FIG. 4, the forming of first metal crack stop 64 can include depositing a metal within opening 62 (optionally in contact with liner 32) and onto adjoining structures, e.g., upper surfaces of ILD 24, conductive region 20, etc. The upper surface of first metal crack stop 64 can then be planarized pursuant to any currently-known or later-developed planarization process, such that an upper surface of first metal crack stop 64 is substantially coplanar with an upper surface of ILD 24 and/or vias 34. Vias 34, along with liner(s) 32, can also be formed of a conductive material and may be formed simultaneously with first metal crack stop 64. For example, first metal crack stop 64 may initially be formed as a continuous body of metal including vias 34 therein, before being structurally separated from vias 34 during a subsequent planarization. Embodiments of the present disclosure therefore provide methodologies by which metal crack stop 64 and vias 34 are formed simultaneously during a single metallization step. As discussed elsewhere herein, a first recess $R_1$ can be present within sidewall S of first metal crack stop 64. First recess $R_1$ can substantially intersect a horizontal interface between barrier film 22 and ILD 24, as well as a horizontal interface between barrier film 22 and insulator 16. In addition, where nitride region 60 extends from insulator 16 into first metal crack stop 64, a second recess $R_2$ can intersect nitride region 60 to further resist horizontal crack propagation around first metal crack stop 64. Among other things, horizontally-propagating delamination cracks can become trapped within recessed areas $R_1$, $R_2$, where they are unlikely to back-propagate out of recessed area R and vertically along vertical sidewall S. For example, in the event that delamination cracks form along to the interface between barrier film 22 and ILD 24 and propagate vertically downward, recess $R_2$ in first metal crack stop 64 can slow or prevent further horizontal growth of the delamination crack.

Figure 11:
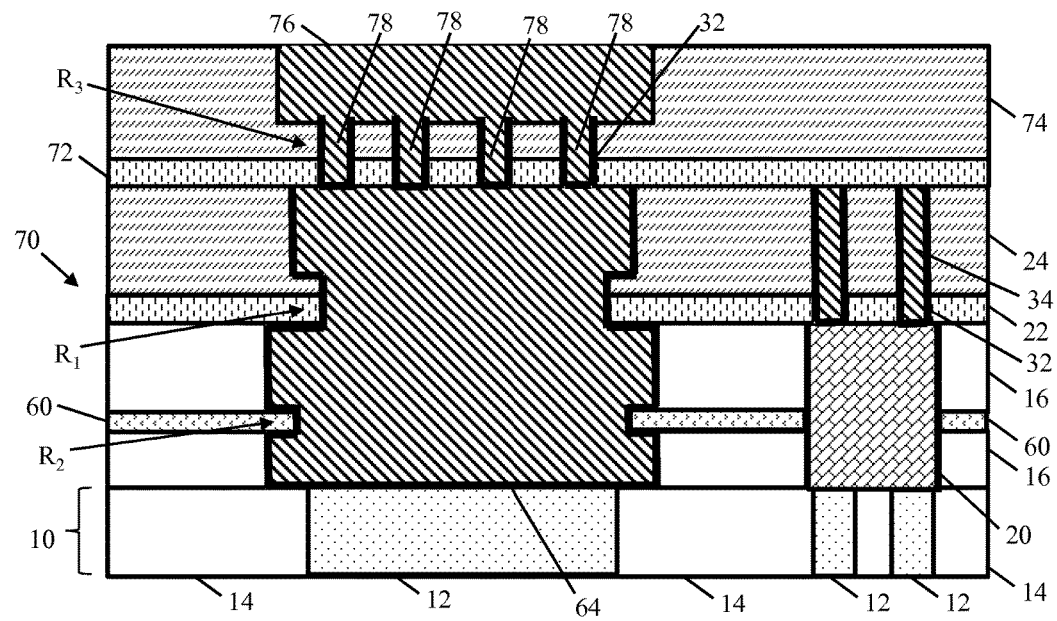
FIG. 11 shows another illustrative IC structure according to embodiments of the present disclosure.

FIG. 11 illustrates a structure 70 according to embodiments of the present disclosure, which can be at least partially formed using process steps discussed herein. A second barrier film 72 and a second ILD 74 can be formed successively over first metal crack stop 64, ILD 24, and/or vias 34. Portions of second barrier film 72 and second ILD 74 can then be removed, to form an additional opening which can be filled with a second metal crack stop 76. Similar to embodiments described elsewhere herein, liner 32 can be formed conformally on second barrier film 72 and second ILD 74 before second metal crack stop 76 is formed. Second metal crack stop 76 can also include a plurality of teeth 78 extending from second barrier film 72 or second ILD 74 to an upper surface of first metal crack stop 64, thereby forming an additional recess $R_3$ positioned vertically over first recess $R_1$. It is also understood, as shown elsewhere herein, that additional vias or metal wires (not shown) can be formed over and in contact with vias 34 to provide electrical connections between metal layers.

Figure 12:
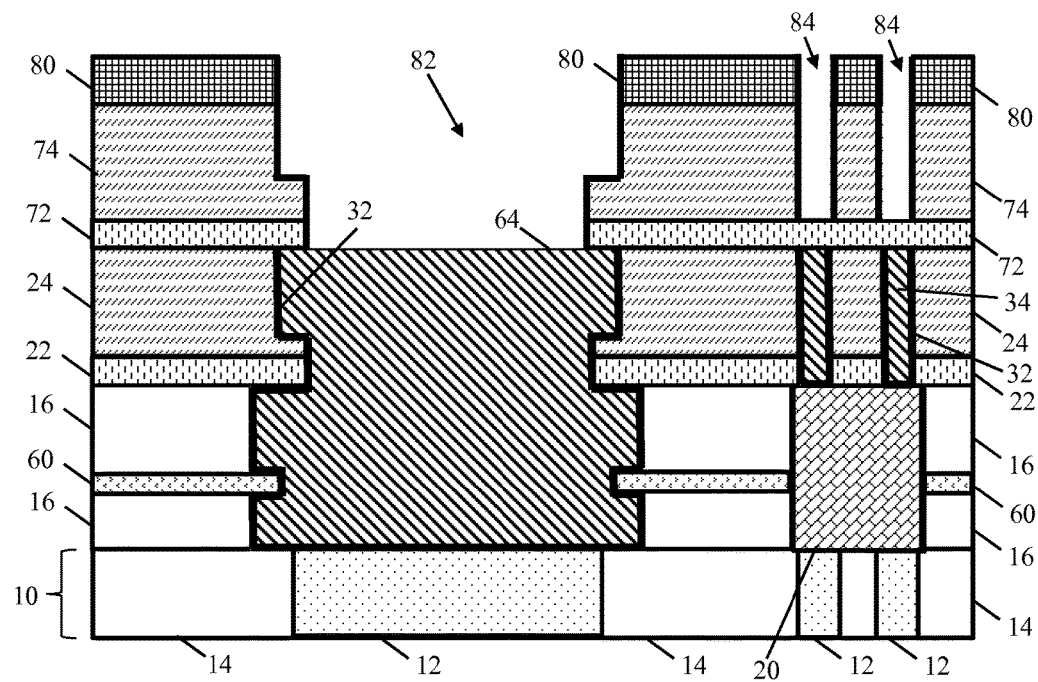
FIG. 12 shows a structure with a metal crack stop and an opening formed in a second barrier film and interlayer dielectric according to embodiments of the present disclosure.

Turning to FIG. 12, additional and optional process steps according to embodiments of the present disclosure are shown. As an addition or alternative to forming second metal crack stop 76 over first metal crack stop 64, embodiments of the present disclosure can include expanding the size of first metal crack stop 64. As shown in FIG. 12, a second-layer hard mask 80 can be formed over second ILD 74 and second barrier film 72. Initially, second barrier film 72 and second ILD 74 can be substantially planar layers without any openings, trenches, etc., included therein. Second-layer hard mask 80 can be patterned such that portions of second barrier film 72 and second ILD 74 can be removed to form a second opening 82 over first metal crack stop 64 and via openings 84 substantially over vias 34. Second opening 82 can be formed substantially according to the processes discussed herein relative to forming opening 62 and FIGS. 7-9. In particular, a portion of second barrier film 72 and second ILD 74 can remain intact over first metal crack stop 64, e.g., by forming a planarizing layer (not shown) and additional mask (not shown) over both second ILD 74 and second-layer hard mask 80, and removing a portion of second barrier film 72 and second ILD 74 to expose first metal crack stop 64. During the formation of second opening 82, via openings 84 can also be formed over an area vertically displaced from second barrier film 72 and/or vias 34.

Figure 13:
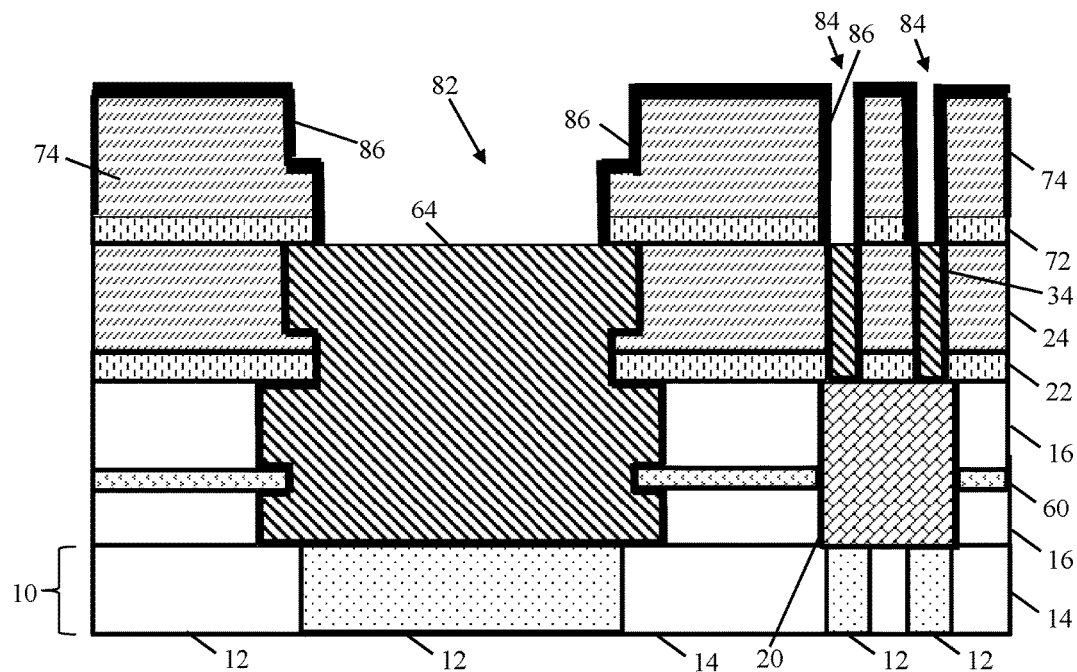
FIG. 13 shows a structure with a second liner formed thereon according to embodiments of the present disclosure.

Referring to FIG. 13, second-layer hard mask 80 can be removed, e.g., by application of a wet or dry etching process, and portions of second barrier film 72 positioned over vias 34 can thereafter be removed. After the forming of second opening 82, a second liner 86 can be formed conformally over at least first metal crack stop 64, second barrier film 72, and second ILD 74. Second liner 86 can have a different material composition from liner 32. Second liner 86, for example, can include manganese-doped (Mn-doped) copper (Cu), or another material capable of bonding with the composition of liner 32, and can be formed by deposition and/or plating onto exposed materials after second opening 82 is formed. In any event, second liner 86 can bond to liner 32 during formation, such that second liner 86 becomes structurally continuous with liner 32 and free of horizontal interfaces along which a delamination crack may continue to propagate. Second liner 86 can be formed within via openings 84 and over vias 34, laterally separated from first metal crack stop 64 and second opening 82. After second liner 86 is formed, processes of the present disclosure can include forming additional metal on vias 34 and/or first metal crack stop 64 (e.g., through use of growth and/or deposition) to increase the size of first metal crack stop 64 and/or vias 34 in separate or shared steps.

Figure 14:
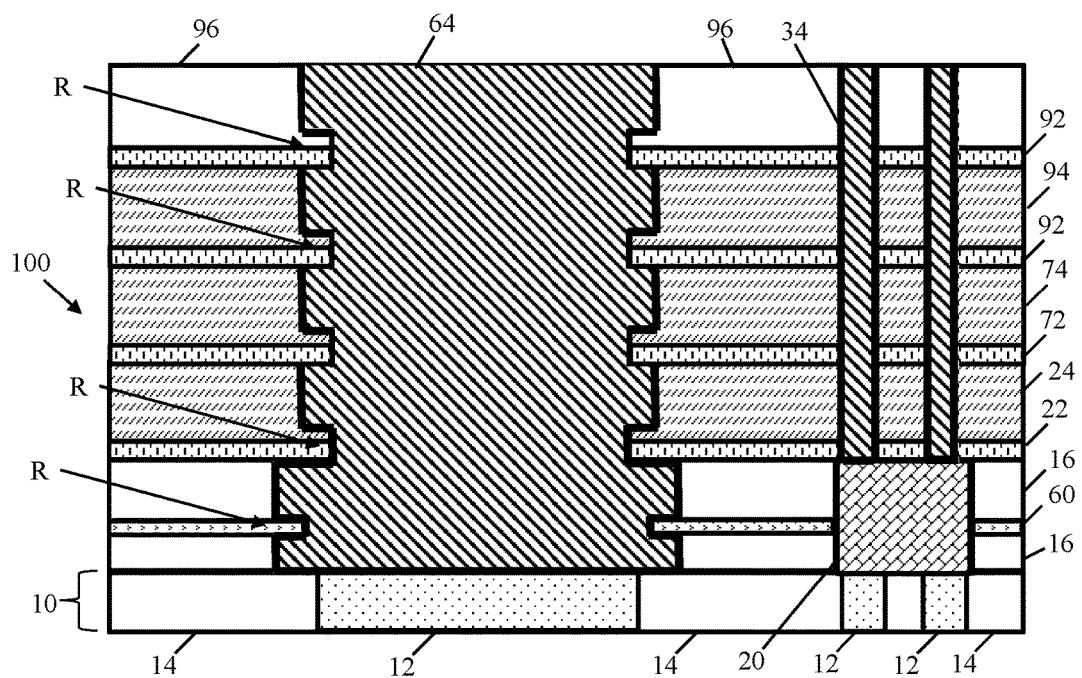
FIG. 14 shows another illustrative IC structure, including multiple barrier films and interlayer dielectrics, according to embodiments of the present disclosure.

As shown in FIG. 14, the processes described herein for increasing the size of first metal crack stop 64 and/or vias 34 can be repeated for each successive metal layer of an IC structure. First metal crack stop 64, when formed according to the processes described herein, can continue to serve as a single, one-piece structure without horizontal interfaces between two separate regions therein. For example, layered barrier films 92 and layered ILDs 94 can be alternatingly formed over ILD 24 and/or second ILD 74. A capping insulator 96 can, optionally, be formed over an uppermost layered barrier film 92 and with a greater thickness than each ILD 24, 74, 94. Capping insulator 96 can include one or more of the example oxide or non-oxide insulator materials discussed herein relative to insulator 16, or can be composed of any other currently-known or later developed electrically insulative material. Capping insulator 96, along with multiple layered barrier films 92 and layered ILDs 94, can be processed to form an opening and/or trenches for further growth of first metal crack stop 64 and/or vias 34. Where processing has concluded, embodiments of the present disclosure can include planarizing an upper surface of first metal crack stop 64, vias 34, and/or capping insulator 96 to form a smoothed surface. In addition, one or more metal wires (not shown) can be formed in contact with via(s) 34, and can extend, e.g., into or out of the plane of the page.

FIG. 14, in depicting further expansion of first metal crack stop 64, illustrates an IC structure 100 according to embodiments of the present disclosure. IC structure 100 can include at least first metal crack stop 64 with a plurality of recesses R positioned substantially along a vertical sidewall thereof, and intersecting a horizontal interface between layered barrier films 92, 22, 72, and ILDs 24, 74, 94, insulator(s) 16, nitride(s) 60, and/or capping insulator 96, where applicable. Pursuant to embodiments of the present disclosure discussed elsewhere herein, and corresponding process steps, IC structure 100 can generally include insulator 16 positioned over substrate 10 (e.g., over semiconductor region(s) 12 and/or over STI(s) 14), with barrier film 22 and ILD 24 successively positioned over insulator 16. First metal crack stop 64 can also be positioned over substrate 10 (e.g., over a semiconductor portion and/or STI(s) 14), and with one or more recesses R positioned within a sidewall thereof. Embodiments of metal crack stop 64 within IC structure 100 can provide, among other things, one or more locations where horizontally-propagating delamination cracks are obstructed or altogether prevented form circumventing first metal crack stop 64 and traveling toward active areas of IC structure 100. In turn, embodiments of the present disclosure can reduce the risk of delamination throughout IC structure 100 or mitigate any effects thereof.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an IC structure, the method comprising:
   providing a structure including:
      a sacrificial metal positioned over a substrate and laterally adjacent to an insulator,
      a first barrier film positioned over and contacting each of the sacrificial metal and the insulator, and
      a first interlayer dielectric positioned over and contacting the first barrier film;
   forming a first opening over the substrate by removing a portion of first interlayer dielectric, a portion of the first barrier film, and the sacrificial metal; and
   forming a first metal crack stop within the first opening and over the substrate, wherein the first metal crack stop includes a continuous metal fill contacting the substrate and laterally adjacent to each of the insulator, the first barrier film, and the first interlayer dielectric.

2. The method of claim 1, further comprising:
   forming a second barrier film over the first interlayer dielectric and an upper surface of the first metal crack stop;
   forming a second interlayer dielectric over the second barrier film;
   forming a second opening within the second barrier film and the second interlayer dielectric by removing a portion of the second interlayer dielectric and the second barrier film to expose an upper surface of the first metal crack stop; and
   forming a second metal crack stop within the second opening and over an upper surface of the second interlayer dielectric, wherein the second metal crack stop includes the continuous metal fill of the first metal crack stop.

3. The method of claim 1, further comprising forming a liner within the first opening and in contact with at least the substrate, the insulator, the interlayer dielectric, and the first barrier film before the forming of the first metal crack stop.

4. The method of claim 3, wherein the liner includes one of tantalum nitride (TaN) and tantalum (Ta).

5. The method of claim 1, wherein the structure further includes a conductive region laterally displaced from the sacrificial metal, the sacrificial metal having a greater width than the conductive region, wherein the removing of the portion of the first interlayer dielectric and the first barrier film positioned over the sacrificial metal includes removing a portion of the first interlayer dielectric positioned over the conductive region to expose a portion of the first barrier film positioned over the conductive region.

6. The method of claim 5, further comprising selectively removing the portion of the first barrier film positioned over the conductive region before forming the first metal crack stop.

7. The method of claim 6, further comprising forming a via over the conductive region during the forming of the first metal crack stop, wherein an upper surface of the via is substantially coplanar with an upper surface of the first interlayer dielectric and an upper surface of the first metal crack stop.

8. A method of forming an IC structure, the method comprising:
   providing a structure including:
      a sacrificial metal positioned over a substrate and laterally adjacent to an insulator,
      a first barrier film positioned over and contacting each of the sacrificial metal and the insulator, and
      a first interlayer dielectric positioned over and contacting the first barrier film;
   forming an opening over the substrate by removing a first portion of the first interlayer dielectric, a first portion of the first barrier film, and the sacrificial metal, wherein a second portion of the interlayer dielectric and a second portion of the first barrier film remain positioned over the sacrificial metal; and
   forming a first metal crack stop within the opening, wherein the first metal crack stop includes a first recess intersecting an interface between the first barrier film and the first interlayer dielectric, and further includes a continuous metal fill contacting the substrate and laterally adjacent to each of the insulator, the first barrier film, and the first interlayer dielectric.

9. The method of claim 8, wherein the structure further includes a conductive region laterally displaced from the sacrificial metal, the sacrificial metal having a greater width than the conductive region, wherein the removing of the first portion of the first interlayer dielectric and the first barrier film positioned over the sacrificial metal includes removing a portion of the first interlayer dielectric positioned over the conductive region to expose the first barrier film positioned over the conductive region.

10. The method of claim 9, further comprising selectively removing the first barrier film positioned over the conductive region before forming the first metal crack stop.

11. The method of claim 10, further comprising forming a via over the conductive region during the forming of the first metal crack stop, wherein an upper surface of the via is substantially coplanar with an upper surface of the first interlayer dielectric and an upper surface of the first metal crack stop.

12. The method of claim 8, wherein the removing of the sacrificial metal further includes removing a portion of the insulator to expose a nitride region embedded within the insulator, and wherein the nitride region extends into the first metal crack stop.

* * * * *